United States Patent
Mitani et al.

(10) Patent No.: US 7,898,360 B2
(45) Date of Patent: Mar. 1, 2011

(54) SURFACE ACOUSTIC WAVE FILTER AND SURFACE ACOUSTIC WAVE DUPLEXER

(75) Inventors: Daisuke Mitani, Osaka (JP); Joji Fujiwara, Osaka (JP); Hiroyuki Nakamura, Osaka (JP); Toru Jibu, Osaka (JP)

(73) Assignee: Panasonic Corporation, Osaka (JP)

( * ) Notice: Subject to any disclaimer, the term of this patent is extended or adjusted under 35 U.S.C. 154(b) by 216 days.

(21) Appl. No.: 12/273,723

(22) Filed: Nov. 19, 2008

(65) Prior Publication Data
US 2009/0134958 A1    May 28, 2009

(30) Foreign Application Priority Data
Nov. 22, 2007   (JP) .................... 2007-302670

(51) Int. Cl.
H03H 9/72   (2006.01)
H03H 9/64   (2006.01)
H03H 9/05   (2006.01)
(52) U.S. Cl. .................... 333/133; 333/193; 333/195
(58) Field of Classification Search .................. 333/133, 333/193–196; 310/313 B, 313 D
See application file for complete search history.

(56) References Cited

U.S. PATENT DOCUMENTS

| | | | |
|---|---|---|---|
| 6,710,682 B2 * | 3/2004 | Onishi et al. | 333/193 |
| 7,030,716 B2 * | 4/2006 | Tsutsumi et al. | 333/133 |
| 7,148,769 B2 * | 12/2006 | Takano | 333/193 |
| 7,295,089 B2 * | 11/2007 | Shibahara et al. | 333/193 |
| 7,459,992 B2 * | 12/2008 | Matsuda et al. | 333/133 |
| 2004/0036381 A1 * | 2/2004 | Abbott et al. | 310/313 R |
| 2005/0285700 A1 * | 12/2005 | Koga et al. | 333/133 |
| 2006/0044081 A1 * | 3/2006 | Tanaka et al. | 333/195 |
| 2007/0013458 A1 * | 1/2007 | Itou et al. | 333/133 |
| 2007/0120626 A1 * | 5/2007 | Makibuchi et al. | 333/193 |

FOREIGN PATENT DOCUMENTS

| | | |
|---|---|---|
| JP | 9-074329 | 3/1997 |
| JP | 10-022763 | 1/1998 |

OTHER PUBLICATIONS

Kadota et al.; "Very Small-Sized Resonator IF Filter Using Shear Horizontal Wave on Quartz Substrate"; 2001 IEEE Ultrasonics Symposium, vol. 1, pp. 65-68, Oct. 7-10, 2001.*

* cited by examiner

Primary Examiner — Barbara Summons
(74) Attorney, Agent, or Firm — Wenderoth, Lind, & Ponack, L.L.P.

(57) ABSTRACT

A surface acoustic wave filter which includes a first terminal at the input side, a second terminal at the output side, a plurality of resonators electrically connected between the first and the second terminals, and a piezoelectric substrate provided on the upper surfaces of first and second terminals and the plurality of resonators. The piezoelectric substrate is made to have a thickness that is not thicker than 0.2 mm. The filtering characteristic of surface acoustic wave filter can be improved by taking advantage of the above structure.

8 Claims, 10 Drawing Sheets

SURFACE ACOUSTIC WAVE FILTER AND SURFACE ACOUSTIC WAVE DUPLEXER

FIELD OF THE INVENTION

The present invention relates to a surface acoustic wave filter and a surface acoustic wave duplexer used in portable telephone units and the like apparatus.

BACKGROUND ART

FIG. 12 is a cross sectional view of a conventional surface acoustic wave filter. In FIG. 12, the conventional surface acoustic wave filter includes first terminal 101 at the input side and second terminal 102 at the output side, a plurality of resonators 103 electrically connected between first terminal 101 and second terminal 102, and piezoelectric substrate 105 provided at the top surface of the above-described resonators 103. A signal of 1800 MHz~2300 MHz is inputted to first terminal 101 at the input side. Piezoelectric substrate 105 is mounted flip chip on base substrate 104 to form a package, which is covered with sealing 106. A resin material is used for sealing 106 in order to secure the adhesion of sealing 106 with base substrate 104. Japanese Patent Unexamined Publication No. H9-74329 and Japanese Patent Unexamined Publication No. H10-22763 are the examples of prior art documents related to the present patent application.

The filtering characteristic of the conventional surface acoustic wave filter, however, remained unsatisfactory. FIG. 13 shows transit characteristic of a conventional surface acoustic wave filter. As FIG. 13 shows in zone A, it demonstrates poor attenuation characteristic at 2140 MHz and the neighborhood, which deteriorated the filtering characteristic.

SUMMARY OF THE INVENTION

The present invention improves the filtering characteristic of surface acoustic wave filters.

Thickness of piezoelectric substrate in the present invention is not thicker than 0.2 mm.

With the above-described structure, the attenuation characteristic at 2140 MHz and the neighborhood can be improved; as the result, the filtering characteristic is improved.

DETAILED DESCRIPTION OF THE INVENTION

First Embodiment

Figure 1:
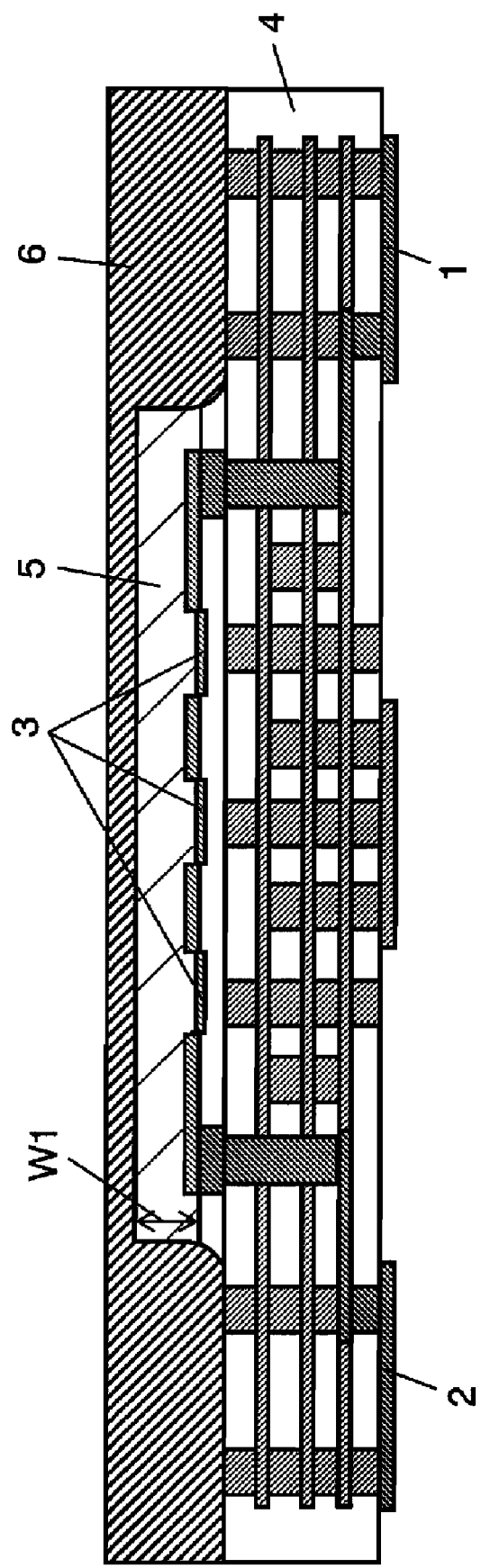
FIG. 1 is a cross sectional view of a surface acoustic wave filter in accordance with a first embodiment of the present invention.

A surface acoustic wave filter in accordance with a first exemplary embodiment of the present invention is described below, referring to the drawings.

Figure 2:
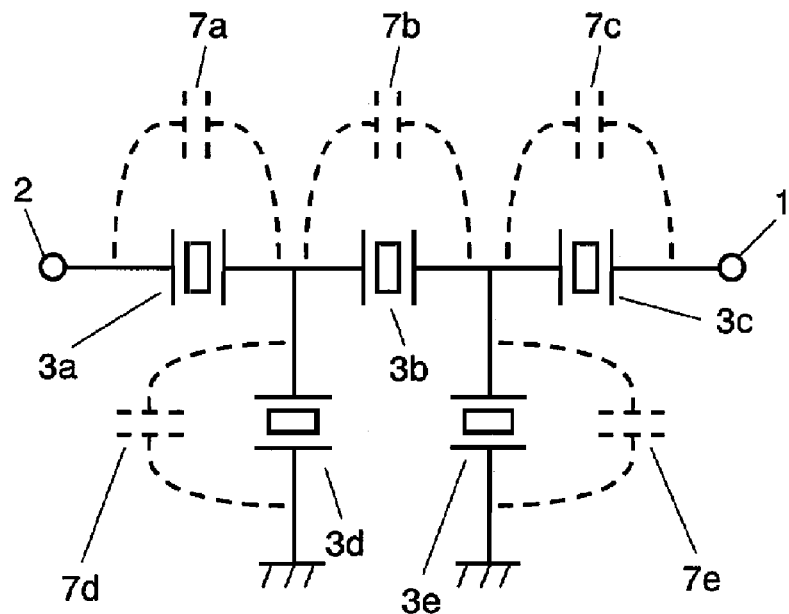
FIG. 2 is an equivalent circuit diagram which shows the connection of resonators in a surface acoustic wave filter in the first embodiment.

FIG. 1 shows a cross sectional view of a surface acoustic wave filter in accordance with a first exemplary embodiment of the present invention. FIG. 2 is an equivalent circuit diagram which shows the connection of resonators in a surface acoustic wave filter of the first embodiment. Referring to FIGS. 1 and 2, the surface acoustic wave filter in the present embodiment includes first terminal 1 at the input side, second terminal 2 at the output side, resonators 3a~3e electrically connected between first terminal 1 and second terminal 2, and piezoelectric substrate 5 provided on the upper surfaces of resonators 3a~3e. Piezoelectric substrate 5 is formed of a material $LiTaO_3$ or $LiNbO_3$.

Resonators 3a~3e of the surface acoustic wave filter shown in FIG. 2 are made with a metal material. In order to protect the metal material from being oxidized, and to protect the surface of resonators 3a~3e from sticking of contaminating materials, which would lead to significant shift in the characteristic, and to make the device strong enough to withstand external stress while providing the way to make the device size smaller, the filter in the first embodiment has a packaged finish. Describing practically, as shown in FIG. 1, piezoelectric substrate 5 having a plurality of resonators 3 is mounted flip chip on base substrate 4, and piezoelectric substrate 5 is covered with sealing resin 6.

In the above-described structure, the attenuation characteristic at the neighborhood of 2140 MHz can be improved by making the thickness W1 of piezoelectric substrate 5 to be not thicker than 0.2 mm. As the result, the characteristic of the filter is improved. How this occurs will be detailed below.

Figure 3:
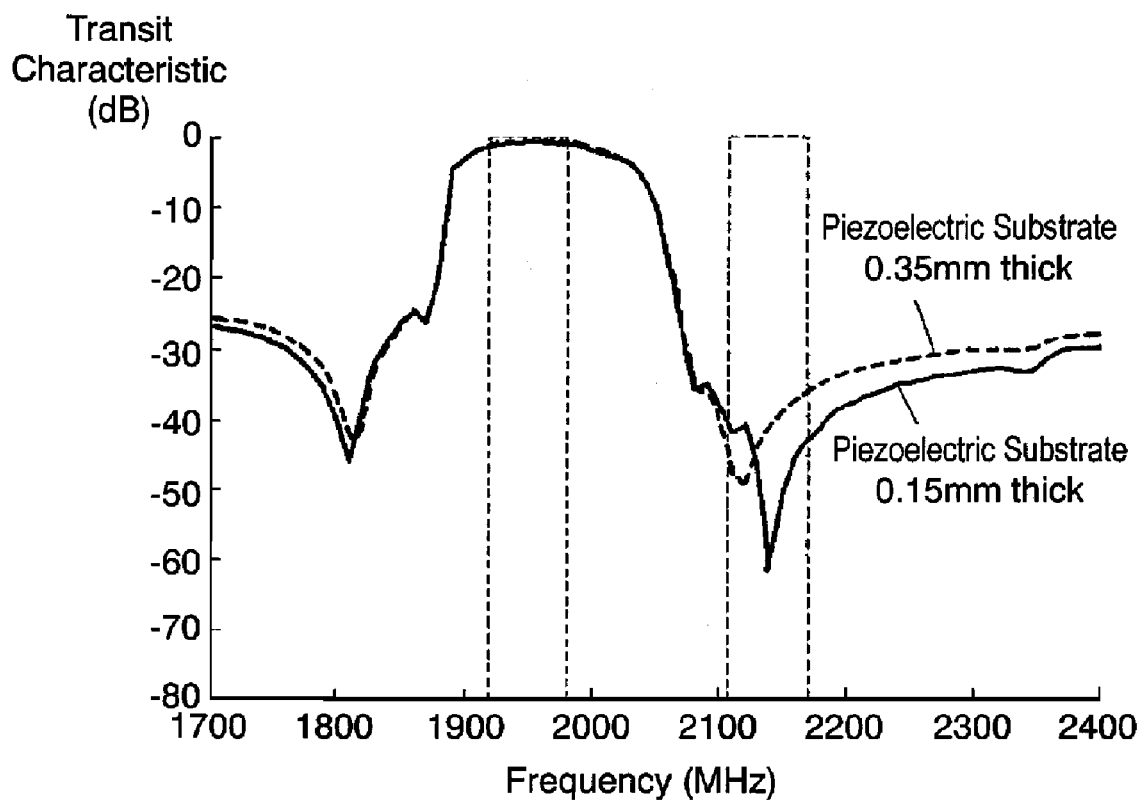
FIG. 3 is a chart showing the transit characteristic of a surface acoustic wave filter in the first embodiment.

FIG. 3 shows a transit characteristic of a surface acoustic wave filter in the first embodiment. In FIG. 3, the horizontal axis represents the frequency of signal inputted to the surface acoustic wave filter, while the vertical axis represents the signal transit characteristic between the input and the output. The smaller the absolute value of transit characteristic (dB) indicated by vertical axis, the easier for a signal to pass through.

This is the type of a filter used in portable telephone system at the transmitting side, where the frequency band 1929 MHz~1980 MHz is used. The filter at the transmitting side is expected to allow only the frequency band to pass as much as possible. So, in the frequency band, the smaller signal attenuation amount represents favorable transit characteristic.

Frequency band 2110 MHz~2170 MHz is used in the system at the receiving side. In order to prevent a signal of this frequency band from intruding into the system of transmitting side, a filter at the transmitting side is requested to maintain the attenuation amount in the frequency band to be higher than a certain specific value. So, in the frequency band, the greater attenuation amount represents favorable attenuation characteristic.

Figure 4:
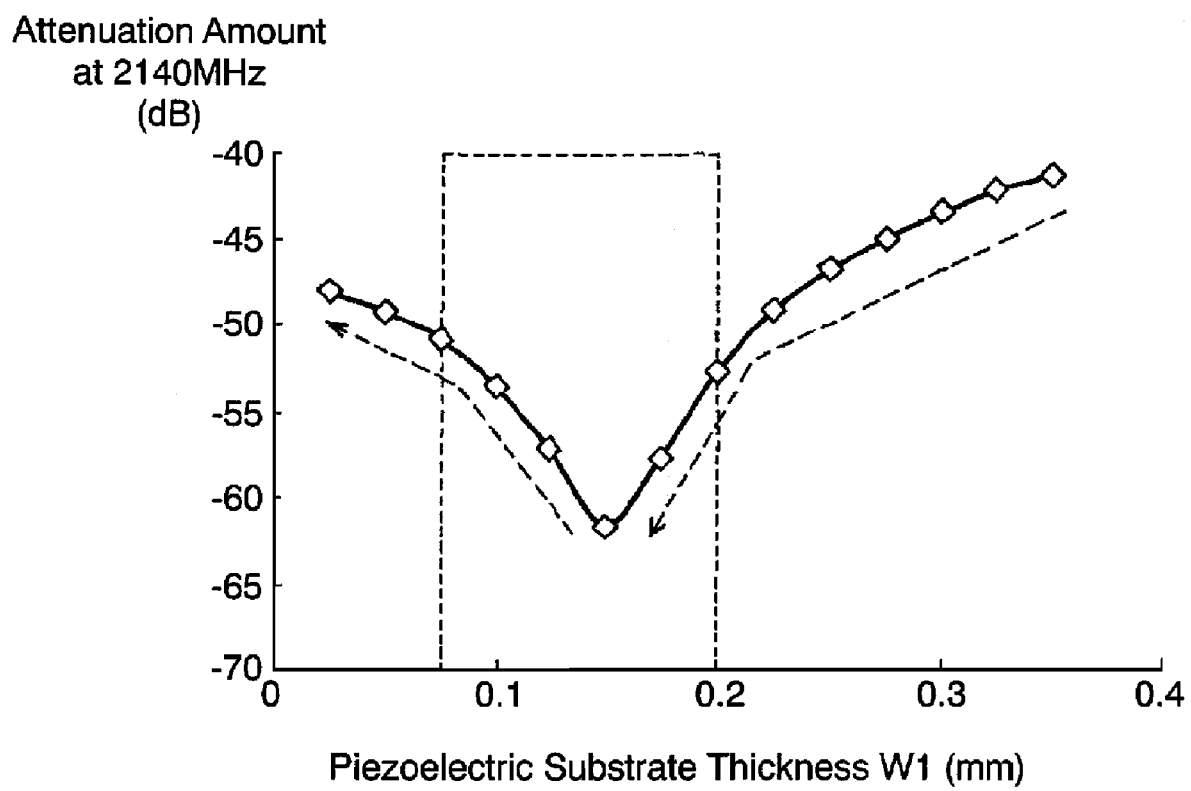
FIG. 4 is a characteristics chart which shows the change in attenuation amount versus thickness of piezoelectric substrate at 2140 MHz in a surface acoustic wave filter in the first embodiment.

FIG. 4 is a characteristics chart which shows the change in attenuation amount versus thickness of piezoelectric substrate at 2140 MHz in a surface acoustic wave filter of the first embodiment. In FIG. 4, the horizontal axis represents the thickness of a piezoelectric substrate W1, while the vertical axis the amount of attenuation (dB) at 2140 MHz. The greater absolute value of attenuation signifies the better characteristic.

Change of the attenuation characteristic at the neighborhood of 2140 MHz was experimented by gradually decreasing the piezoelectric substrate's 5 thickness W1 from 0.35 mm to 0.025 mm. FIG. 4 shows the results. Attenuation characteristic gradually improved along with thinning of piezoelectric substrate 5 from 0.35 mm thick; the attenuation characteristic hit the best at the vicinity of 0.15 mm; and then deteriorated along with the further thinning. In the thickness range with piezoelectric substrate 5 not thinner than 0.075 mm and not thicker than 0.2 mm, an attenuation amount at 2140 MHz is below −50 dB, a favorable attenuation characteristic. Even at the thinnest thickness of 0.025 mm, it showed an attenuation characteristic which is better than that at thickness of 0.35 mm.

The solid line in FIG. 3 shows the filter characteristic after the piezoelectric substrate's 5 thickness W1 was changed from the conventional 0.35 mm to 0.15 mm thick. As compared with the dotted line, the attenuation characteristic at 2140 MHz is improved, as shown in FIG. 3, from −41.1 dB to −61.5 dB.

The above results of the experiment indicate that the attenuation characteristic of the filter can be improved by making the thickness W1 of piezoelectric substrate 5 to be not thicker than 0.2 mm, preferably not thinner than 0.075 mm and not thicker than 0.2 mm.

The improvement in the attenuation characteristic seems to have been brought about as the result of reduced capacitance coupling created in parallel to the resonator. Since piezoelectric substrate 5 has a high dielectric constant, various kinds of electrical coupling components are generated inside the piezoelectric substrate. For example, as shown in FIG. 2, capacitance couplings 7a~7e and the like unwanted coupling components are formed in parallel with the plurality of resonators 3a~3e, respectively. This is one of the factors which deteriorated the characteristic. Since these capacitance couplings 7a~7e are the components formed through the inside of a piezoelectric substrate, a thick piezoelectric substrate 5 which provides a broad coupling path prone to generating more of such components. Contrary, in a thin piezoelectric substrate 5, the coupling path is narrowed and the generation of capacitance coupling can be made less. Thus, the improvement in the attenuation characteristic of filter is considered to have been implemented by the reasons as described above.

The description in the first embodiment has been based on a structure where piezoelectric substrate 5 is covered with sealing resin 6 to provide a package. However, an insulating material other than resin may be used in place of sealing resin 6 for implementing the advantage identical to that of the present invention. Furthermore, a filter can be offered with a sealing material, such as sealing resin 6, eliminated.

Second Embodiment

A surface acoustic wave duplexer in accordance with a second exemplary embodiment of the present invention is described referring to the drawings.

Figure 5:
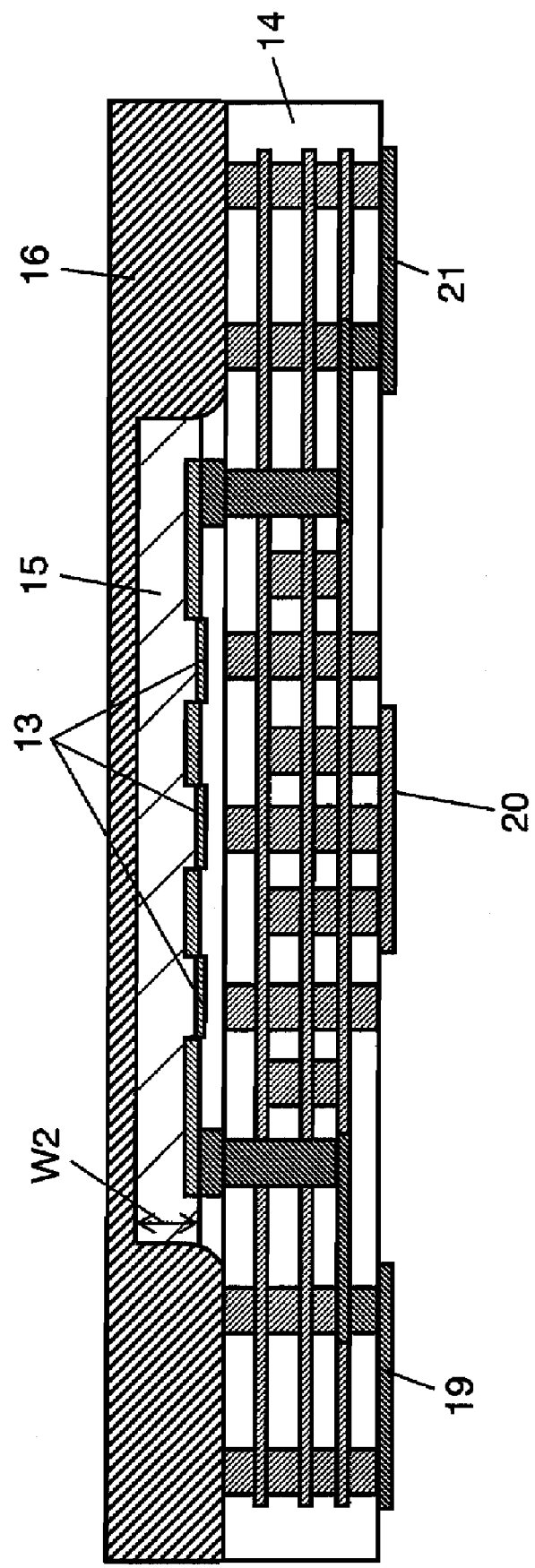
FIG. 5 is a cross sectional view of a surface acoustic wave duplexer in accordance with a second embodiment of the present invention.
Figure 6:
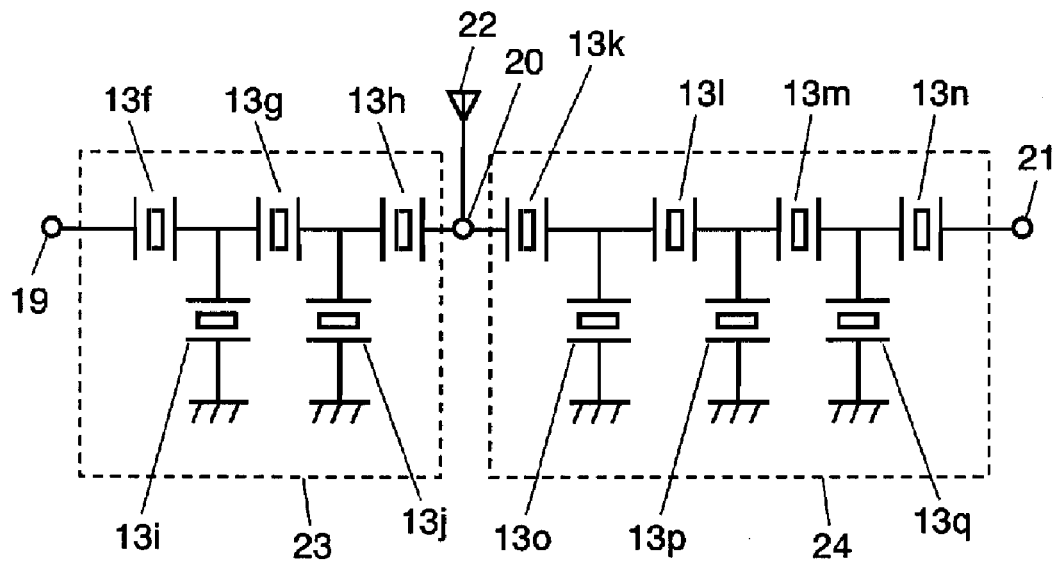
FIG. 6 is an equivalent circuit diagram which shows the connection of resonators in a surface acoustic wave duplexer in the second embodiment.

FIG. 5 is a cross sectional view of a surface acoustic wave duplexer in accordance with the second embodiment of the present invention. FIG. 6 is an equivalent circuit diagram which shows the connection of resonators in a surface acoustic wave duplexer in the second embodiment. Reference is made to FIGS. 5 and 6, a surface acoustic wave duplexer in the second embodiment includes transmitting terminal 19, antenna terminal 20 which is electrically connected with transmitting terminal 19 and antenna 22, receiving terminal 21 electrically connected with antenna terminal 20, resonators 13f, 13g, 13h, 13i, 13j intervening between transmitting terminal 19 and antenna terminal 20, resonators 13k, 13l, 13m, 13n, 13o, 13p, 13q intervening between antenna terminal 20 and receiving terminal 21, and, as shown in FIG. 5, piezoelectric substrate 15 disposed on the upper surfaces of the plurality of resonators 13. Piezoelectric substrate 15 is provided using a material $LiTaO_3$ or $LiNbO_3$. The plurality of resonators 13 and the piezoelectric substrate 15 disposed on the upper surfaces of resonators 13 are forming a package, as shown in FIG. 5.

Surface acoustic wave duplexer in the second embodiment is a device in which a single antenna 22 is shared in common by transmitting filter 23 and receiving filter 24. Transmitting filter 23 is formed of a plurality of resonators 13f, 13g, 13h, 13i, 13j disposed between transmitting terminal 19 and antenna terminal 20, while receiving filter 24 is formed of a plurality of resonators 13k, 13l, 13m, 13n, 13o, 13p, 13q disposed between antenna terminal 20 and receiving terminal 21.

Figure 7:
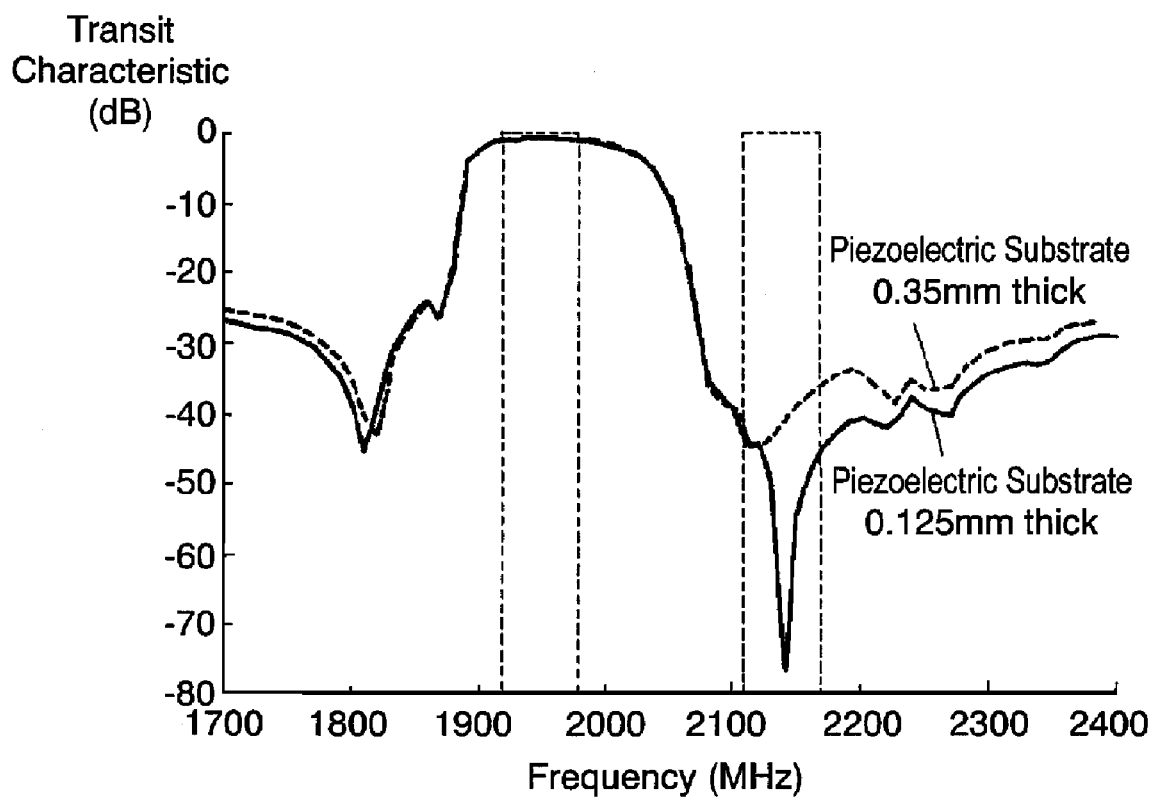
FIG. 7 is a chart showing the transit characteristic of a surface acoustic wave duplexer in the second embodiment.

FIG. 7 is a chart which shows the transit characteristic of a surface acoustic wave duplexer in the second embodiment. In FIG. 7, the horizontal axis represents the frequency, and the vertical axis represents the transit characteristic. Transmitting filter 23 of the surface acoustic wave duplexer is used in portable telephone system at the transmitting side.

Figure 8:
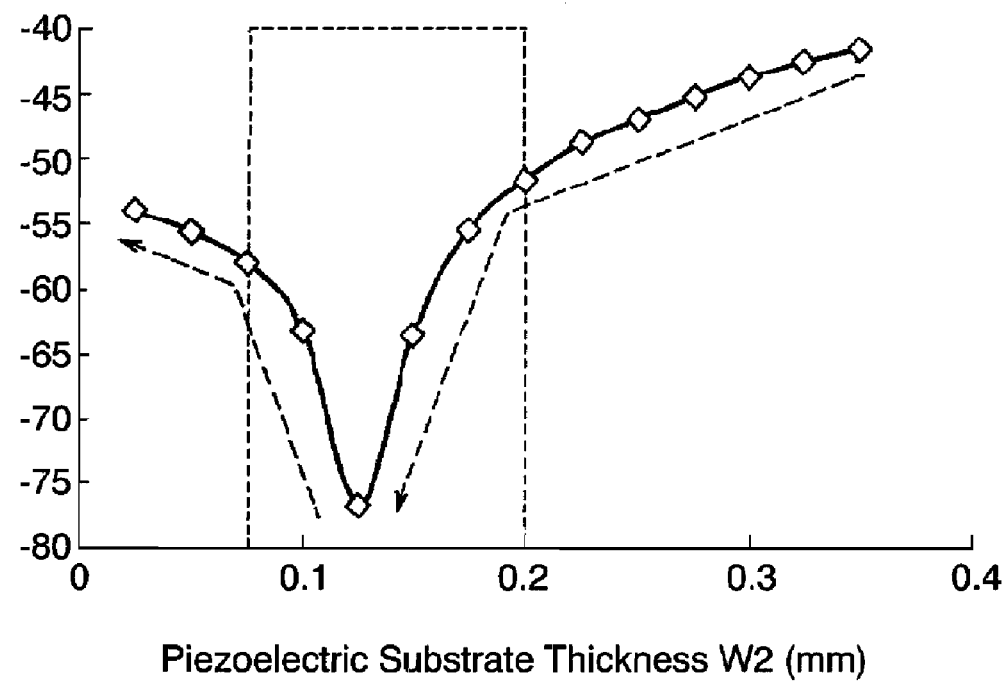
FIG. 8 is a characteristic chart which shows the change in attenuation amount versus thickness of piezoelectric substrate at 2140 MHz in a surface acoustic wave duplexer in the second embodiment.

FIG. 8 is a characteristics chart which shows the change in attenuation amount versus thickness of a piezoelectric substrate at 2140 MHz in a surface acoustic wave duplexer in the second embodiment. Referring to FIG. 8, the attenuation characteristic gradually improves along with a gradual thinning W2 of piezoelectric substrate 15 from thickness 0.35 mm; the characteristic hit the best at the vicinity of a thickness of 0.125 mm; and then deteriorated along with further thinning. In the range of piezoelectric substrate 15 thickness not thinner than 0.075 mm and not thicker than 0.2 mm, the attenuation amount at 2140 MHz is below −50 dB, which means a favorable attenuation characteristic. The attenuation characteristic demonstrated at the thinnest thickness of 0.025 mm is better than that at a thickness of 0.2 mm. Thus, the attenuation characteristic is improved through the entire range up to 'not thicker than 0.2 mm'.

Solid line in FIG. 7 shows the filter characteristic after a thickness W2 of piezoelectric substrate 15 was changed from the conventional thickness 0.35 mm to 0.125 mm. As compared with the dotted line, the attenuation characteristic at 2140 MHz is improved, from −41.8 dB to −76.75 dB.

As described in the above, the attenuation characteristic of a filter in the surface acoustic wave duplexer can be improved by making a thickness W2 of piezoelectric substrate 15 to be not thicker than 0.2 mm; preferably, not thinner than 0.075 mm and not thicker than 0.2 mm.

Third Embodiment

A surface acoustic wave filter in accordance with a third exemplary embodiment of the present invention is described referring to the drawings.

Figure 9:
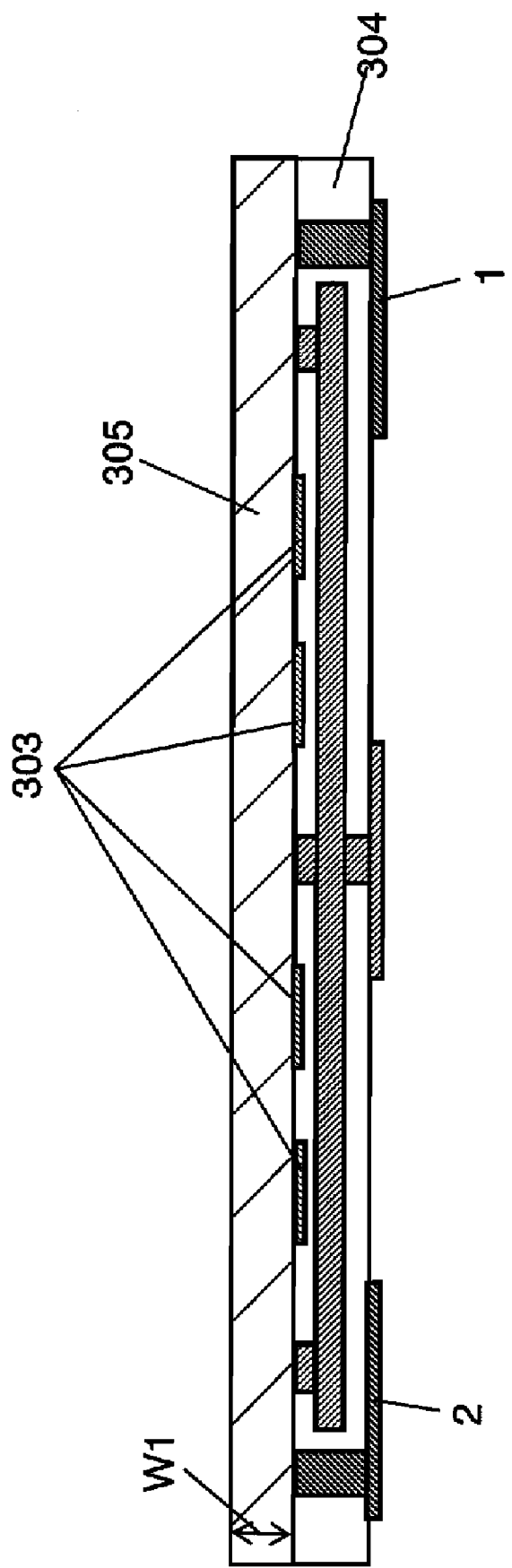
FIG. 9 is a cross sectional view of a surface acoustic wave filter in accordance with a third embodiment of the present invention.

FIG. 9 is a cross sectional view of a surface acoustic wave filter in the third embodiment. In FIG. 9, a surface acoustic wave filter in the third embodiment includes a plurality of resonators 303, and piezoelectric substrate 305 which is disposed on the upper surfaces of the resonators. Piezoelectric substrate 305 is mounted on base substrate 304, building up a structure of a sealed package in which there is a certain gap secured between the base substrate and the piezoelectric substrate at its surface mounted with the resonators. The resin seal 6 covering piezoelectric substrate 5 described in the first embodiment (FIG. 1) has been eliminated in a surface acoustic wave filter in accordance with third embodiment. By introducing such a package structure, the package size can be made to be smaller than the ones described in the first and the second embodiments.

Figure 10:
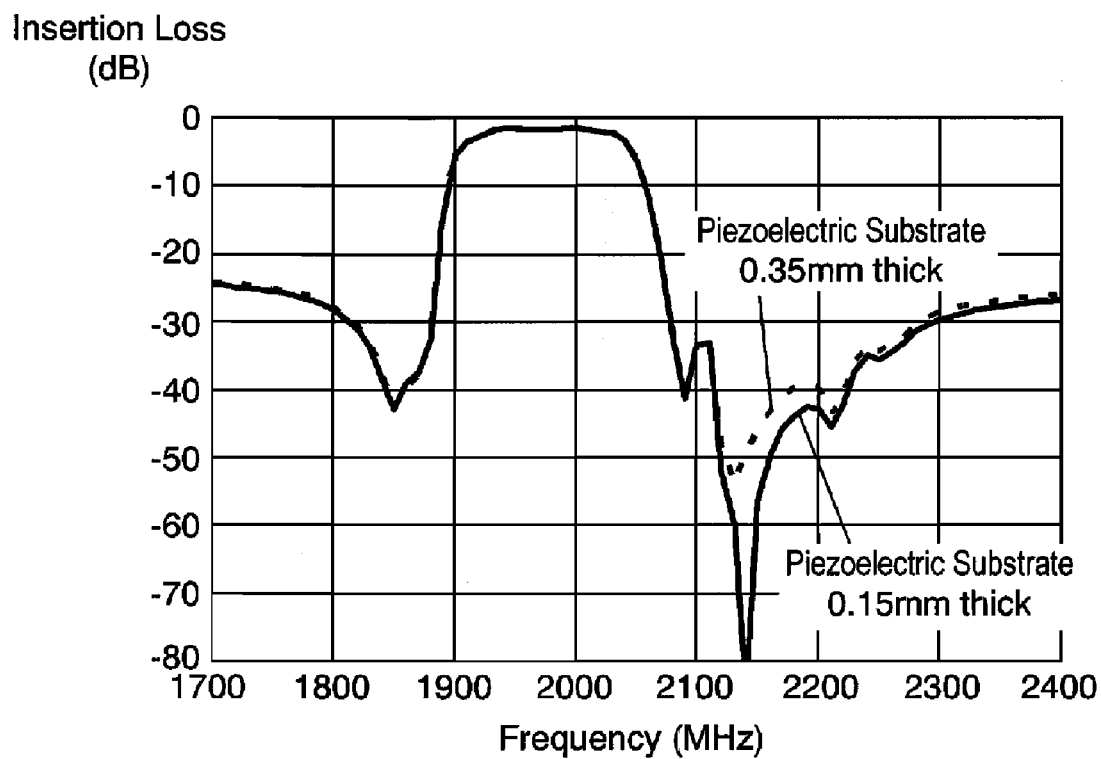
FIG. 10 is a transit characteristic chart of a surface acoustic wave filter in the first embodiment.

FIG. 10 is a transit characteristic chart of a surface acoustic wave filter in the first embodiment. Referring to FIG. 10, the present surface acoustic wave filter is for use in a portable telephone system at the transmitting side where the same frequency band as the first embodiment is used. Solid line in FIG. 10 shows the filter characteristic after a thickness W1 of piezoelectric substrate 305 was changed from the conventional thickness 0.35 mm to 0.15 mm. As compared with the dotted line, the attenuation characteristic at 2140 MHz is improved from approximately −50 dB to approximately −70 dB.

Figure 11:
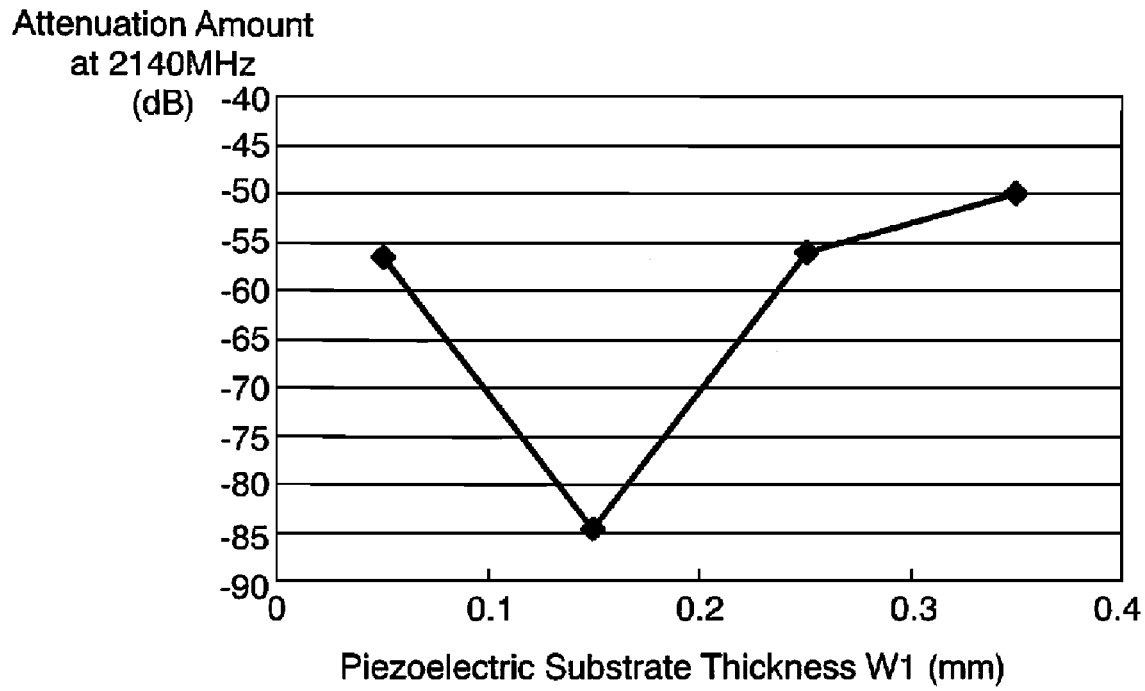
FIG. 11 is a characteristic chart which shows the change in attenuation amount versus thickness of piezoelectric substrate at 2140 MHz in a surface acoustic wave filter in the third embodiment.
Figure 12:
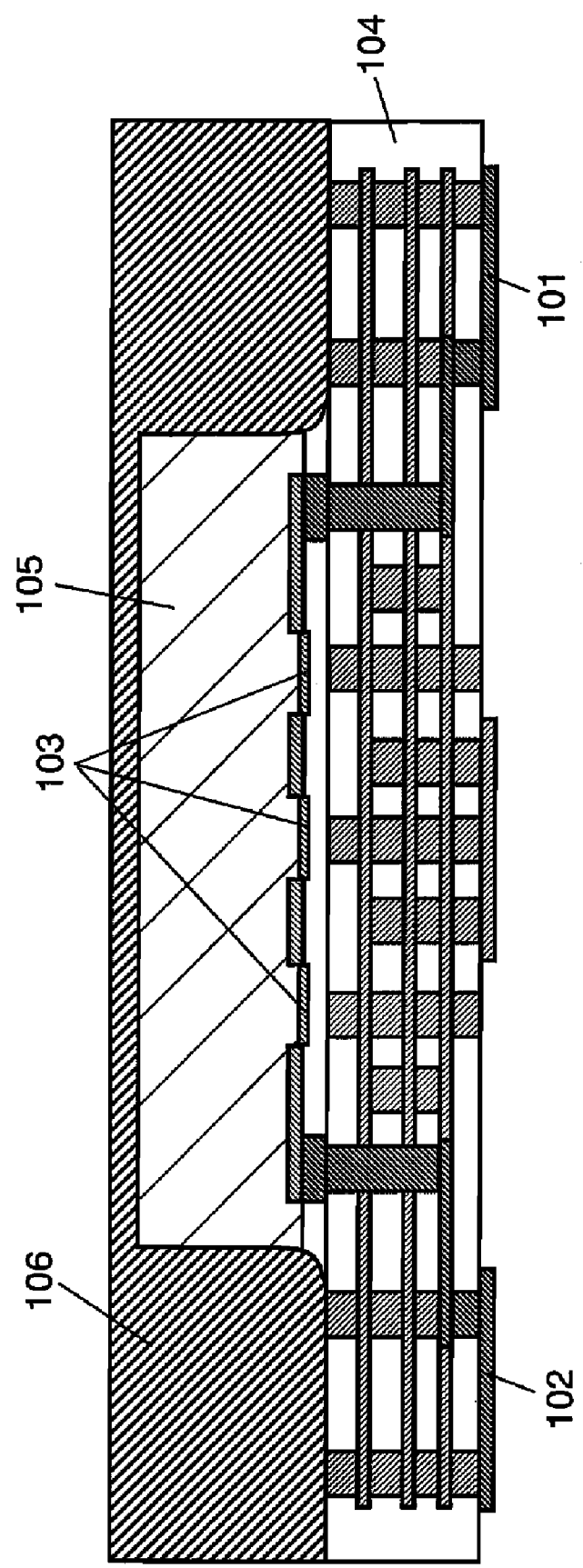
FIG. 12 is a cross sectional view of a conventional surface acoustic wave filter.
Figure 13:
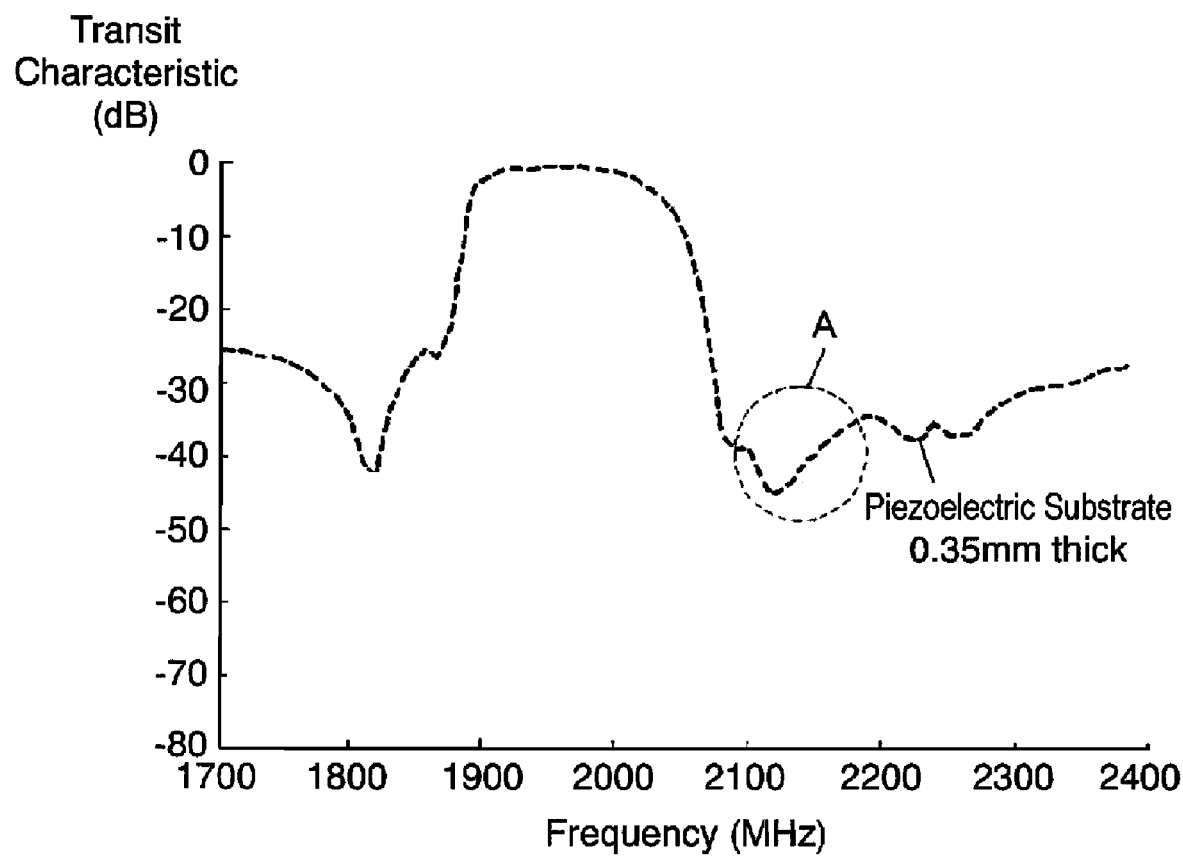
FIG. 13 is a transit characteristic chart of a conventional surface acoustic wave filter.

FIG. 11 is a characteristics chart which shows the change in attenuation amount versus thickness of a piezoelectric substrate at 2140 MHz in a surface acoustic wave filter in the third embodiment. Referring to FIG. 11, the attenuation characteristic gradually improves along with a gradual thinning of thickness W1 of piezoelectric substrate 305, from a thickness of 0.35 mm; the characteristic hit the best at the vicinity of a thickness of 0.15 mm; and then deteriorated along with further thinning. Within the thickness range of piezoelectric substrate 305 where it is not thinner than 0.075 mm and not thicker than 0.2 mm, good attenuation characteristic is offered.

As described above, the attenuation characteristic of a surface acoustic wave filter can be improved also with one that is mounted at the wafer level and packaged if a thickness W1 of piezoelectric substrate 305 is made to be not thicker than 0.2 mm, preferably, not thinner than 0.075 mm and not thicker than 0.2 mm.

Description in the third embodiment has been based on the wafer level-mounted and packaged surface acoustic wave filter. However, the surface acoustic wave duplexer of the same structure also offers the advantage identical to that of the third embodiment.

The piezoelectric substrate of the surface acoustic wave filter and the surface acoustic wave duplexer is formed of a single material. However, it is not limited to such a structure; for example, the piezoelectric substrate may be formed by integrating a plurality of substrates each made of a different material. A substrate of the latter structure generates the advantage that is identical to that in the present invention. Also in the composite substrate formed of a plurality of substrates of the different material, total thickness should be not thicker than 0.2 mm; preferably, not thinner than 0.075 and not thicker than 0.2 mm.

Description of the surface acoustic wave filter and the surface acoustic wave duplexer in the present invention has been based on such a structure where it is mounted flip chip and resin-sealed. However, it is to be understood that it is not the intention of present invention to limit the scope to the above-described structure. The advantage identical to that of the present invention can be generated also by those having a structure where a piezoelectric substrate is not provided with a shield electrode at the reverse surface, viz. the surface having no resonator mounted. The structure of mounting at wafer level, the boundary wave device, etc. will also provide identical advantage.

Surface acoustic wave filters and surface acoustic wave duplexers in accordance with the present invention demonstrate high filtering characteristic. It would offer a substantial advantage when used in portable telephone or the like electronic apparatus, among other fields.

What is claimed is:

1. A surface acoustic wave filter comprising:
a first terminal;
a second terminal;
a resonator electrically connected between the first terminal and the second terminal; and
a piezoelectric substrate provided on the upper surfaces of the first terminal, the second terminal, and the resonator, wherein a thickness of the piezoelectric substrate is not thinner than 0.075 mm and not thicker than 0.2 mm.

2. The surface acoustic wave filter of claim 1, wherein the piezoelectric substrate is mounted flip chip on a base substrate, and
the piezoelectric substrate is resin-sealed and packaged.

3. The surface acoustic wave filter of claim 1, wherein the piezoelectric substrate is formed of a material $LiTaO_3$ or $LiNbO_3$.

4. The surface acoustic wave filter of claim 1, wherein a signal of 1800 MHz~2300 MHz transits between the first terminal and the second terminal.

5. A surface acoustic wave duplexer comprising:
a transmitting terminal;
a receiving terminal;
an antenna terminal;
a first resonator electrically connected between the transmitting terminal and the antenna terminal;
a second resonator electrically connected between the receiving terminal and the antenna terminal; and
a piezoelectric substrate provided on the upper surfaces of the transmitting terminal, the receiving terminal, the antenna terminal, the first resonator, and the second resonator,
wherein a thickness of the piezoelectric substrate is not thinner than 0.075 mm and not thicker than 0.2 mm.

6. The surface acoustic wave duplexer of claim 5, wherein the piezoelectric substrate is mounted flip chip on a based substrate, and
the piezoelectric substrate is resin-sealed and packaged.

7. The surface acoustic wave duplexer of claim 5, wherein the piezoelectric substrate is made of a material $LiTaO_3$ or $LiNbO_3$.

8. The surface acoustic wave duplexer of claim 5, wherein a signal of 1800 MHz~2300 MHz transits between the antenna terminal and at least one of the transmitting terminal and the receiving terminal.

* * * * *